US012645852B2

(12) United States Patent
Chae et al.

(10) Patent No.: US 12,645,852 B2
(45) Date of Patent: Jun. 2, 2026

(54) METHOD FOR ANALYZING EFFECT OF HYGROSCOPIC SEEDING MATERIAL SPRAYED ON GROUND AEROSOL CONCENTRATION THROUGH AIRBORNE CLOUD SEEDING EXPERIMENT

(71) Applicant: NATIONAL INSTITUTE OF METEOROLOGICAL SCIENCES, Seogwipo-si (KR)

(72) Inventors: Sang hee Chae, Seogwipo-si (KR); Ki Ho Chang, Seoul (KR); Yun Kyu Lim, Seogwipo-si (KR); Woon seon Jung, Seogwipo-si (KR); Jung Mo Ku, Seogwipo-si (KR); Chul Kyu Lee, Seoul (KR)

(73) Assignee: NATIONAL INSTITUTE OF METEOROLOGICAL SCIENCES, Seogwipo-si (KR)

( * ) Notice: Subject to any disclaimer, the term of this patent is extended or adjusted under 35 U.S.C. 154(b) by 1074 days.

(21) Appl. No.: 17/547,890

(22) Filed: Dec. 10, 2021

(65) Prior Publication Data

US 2023/0126982 A1 Apr. 27, 2023

(30) Foreign Application Priority Data

Oct. 21, 2021 (KR) ......................... 10-2021-0141066

(51) Int. Cl.
*G06F 30/25* (2020.01)
*A01G 15/00* (2006.01)
*G06F 30/20* (2020.01)

(52) U.S. Cl.
CPC .............. *G06F 30/25* (2020.01); *G06F 30/20* (2020.01); *A01G 15/00* (2013.01)

(58) Field of Classification Search
None
See application file for complete search history.

(56) References Cited

U.S. PATENT DOCUMENTS

2012/0253769 A1* 10/2012 Poondru .................. G06G 7/57
703/9

OTHER PUBLICATIONS

Yin, Yan, Zev Levin, Tamir Reisin, and Shalva Tzivion. "Seeding convective clouds with hygroscopic flares: Numerical simulations using a cloud model with detailed microphysics." Journal of Applied Meteorology 39, No. 9 (2000): 1460-1472. (Year: 2000).*

(Continued)

*Primary Examiner* — Rehana Perveen
*Assistant Examiner* — Kyle H Tseng
(74) *Attorney, Agent, or Firm* — CANTOR COLBURN LLP

(57) ABSTRACT

Provided is a method for analyzing an effect of a hygroscopic seeding material sprayed through an airborne cloud seeding experiment on ground aerosol concentrations, including the steps of: inputting information of meteorological fields and seeding spraying of the airborne cloud seeding experiment to a numerical cloud seeding model to execute a numerical simulation; calculating a mass concentration of the hygroscopic seeding material on ground, based on results of the numerical simulation; and calculating a contribution degree of the hygroscopic seeding material to mass concentrations of aerosols, based on comparison between the calculated mass concentration of the hygroscopic seeding material and the mass concentrations of the aerosols observed on an execution date of the airborne cloud seeding experiment.

9 Claims, 5 Drawing Sheets

(56) References Cited

OTHER PUBLICATIONS

Gifford, F. A. "Atmospheric dispersion models for environmental pollution applications." In Lectures on air pollution and environmental impact analyses, pp. 35-58. Boston, MA: American Meteorological Society, 1975. (Year: 1975).*

Cray Research, "CRAY J932 Hardware Overview." Last modified Apr. 1998. https://cray.modularcircuits.com/cray_docs/hw/j90/HMM-193-A-Hardware_Overview_for_CRAY_J932_System-April_1998.pdf. (Year: 1998).*

The Editors of Encyclopaedia Britannica. "density." Encyclopedia Britannica, Mar. 19, 2020. https://www.britannica.com/science/density. (Year: 2020).*

Debry, Edouard, Bruno Sportisse, and Benjamin Jourdain. "A stochastic approach for the numerical simulation of the general dynamics equation for aerosols." Journal of Computational Physics 184, No. 2 (2003): 649-669. (Year: 2003).*

Minso Shin, Yoojin Kang, Seohui Park, Jungho Im, Cheolhee Yoo & Lindi J. Quackenbush (2020) Estimating ground-level particulate matter concentrations using satellite-based data: a review, GIScience & Remote Sensing, 57:2, 174-189, DOI: 10.1080/15481603.2019.1703288 (Year: 2020).*

Yu, Fangqun, and Gan Luo. "Simulation of particle size distribution with a global aerosol model: contribution of nucleation to aerosol and CCN number concentrations." Atmospheric Chemistry and Physics 9, No. 20 (2009): 7691-7710. (Year: 2009).*

Fisher, James Mitchell. "Trace chemical evaluation of cloud seeding in the Payette Basin." (2017). (Year: 2017).*

* cited by examiner

METHOD FOR ANALYZING EFFECT OF HYGROSCOPIC SEEDING MATERIAL SPRAYED ON GROUND AEROSOL CONCENTRATION THROUGH AIRBORNE CLOUD SEEDING EXPERIMENT

BACKGROUND OF THE INVENTION

Field of the Invention

The present invention relates to a method for analyzing an effect of a hygroscopic seeding material sprayed through an airborne cloud seeding experiment on ground aerosol concentrations.

Background of the Related Art

Recently, precipitation deviations become big according to districts or seasons due to climate change, so that water shortages occur frequently all over the world.

Accordingly, dam construction, river bank filtration, seawater desalination, and a cloud seeding experiment are considered as plans for solving water shortages. Among the plans for overcoming water shortages, the cloud seeding experiment may minimize environmental pollution and have a relatively low cost when compared to other plans, and accordingly, the cloud seeding experiment is conducted in many countries of the world.

Cloud seeding is a technique that artificially sprays a seeding material to activate cloud development and condensation of precipitation so that a lot of precipitation is produced. The seeding material may include silver iodide (AgI) acting as a nucleus for the formation of an ice crystal, calcium chloride ($CaCl_2$) or sodium chloride (NaCl) acting as a condensation nucleus as a hygroscopic seeding material, and/or dry ice (solid $CO_2$) for drastically lowering a surrounding temperature to perform reduction of supersaturation and conversion of supercooled water droplets into ice crystals. Among them, silver iodide and dry ice are generally applied to cold clouds (with a temperature less than 0° C.) or mixed-phase clouds, and the hygroscopic seeding material is applied to warm clouds (with a temperature greater than or equal to 0° C.)

The cloud seeding experiment may be classified into an airborne experiment and a ground experiment, and generally, it is known that the airborne experiment is more effective than the ground experiment. The airborne experiment is conducted by spraying a hygroscopic seeding material or dry ice through combustion of silver iodide or flare as the hygroscopic seeding material using an aircraft. The ground experiment is conducted by spraying a hygroscopic seeding material through combustion of a liquid seeding material solution or flare on the ground.

Recently, technologies for analyzing an effect of the seeding material sprayed through the cloud seeding experiment on weather and atmospheric environments and for checking safety of the cloud seeding experiment have been actively developed.

SUMMARY OF THE INVENTION

Accordingly, the present invention has been made in view of the above-mentioned problems occurring in the related art, and it is an object of the present invention to provide a method for analyzing an effect of a hygroscopic seeding material sprayed through an airborne cloud seeding experiment on ground aerosol concentrations.

In specific, it is an object of the present invention to provide a method for analyzing an effect of a hygroscopic seeding material sprayed on ground aerosol concentrations when a cloud seeding experiment is executed to spray the hygroscopic seeding material onto warm clouds (with a temperature greater than or equal to 0° C.) through an aircraft, to thus calculate the effect of the hygroscopic seeding material to the ground aerosol concentrations, that is, a contribution degree of the hygroscopic seeding material to the ground aerosol concentrations.

To accomplish the above-mentioned objects, according to one aspect of the present invention, there is provided a method for analyzing an effect of a hygroscopic seeding material sprayed through an airborne cloud seeding experiment on ground aerosol concentrations, the method including the steps of: inputting information of meteorological fields and seeding spraying (seeding time, seeding rate, and spraying position (grid information)) of the airborne cloud seeding experiment for spraying the hygroscopic seeding material to a numerical cloud seeding model to execute a numerical simulation using the numerical cloud seeding model; calculating a mass concentration of the hygroscopic seeding material on ground, based on results of the numerical simulation; and calculating a contribution degree of the hygroscopic seeding material to mass concentrations of aerosols, based on comparison between the calculated mass concentration of the hygroscopic seeding material and the mass concentrations of the aerosols observed on an execution date of the airborne cloud seeding experiment.

According to the present invention, desirably, the step of calculating the mass concentration of the hygroscopic seeding material on ground is carried out based on a number concentration of the hygroscopic seeding material which is calculated from the numerical simulation through the numerical cloud seeding model.

According to the present invention, desirably, the step of calculating the mass concentration of the hygroscopic seeding material on ground may include the steps of: calculating a mean diameter of one particle of the hygroscopic seeding material, based on the number of total particles of flares of the hygroscopic seeding material and a diameter of a geometric mean particle, which are predetermined; calculating a volume of one mean particle of the hygroscopic seeding material, based on the calculated mean diameter of one particle of the hygroscopic seeding material; calculating mean mass of one particle of the hygroscopic seeding material, based on a density of the hygroscopic seeding material and the calculated volume of one mean particle of the hygroscopic seeding material; and calculating the mass concentration of the hygroscopic seeding material, based on the calculated mean mass of one particle of the hygroscopic seeding material and the number concentration of the hygroscopic seeding material.

According to the present invention, desirably, the step of calculating the mass concentration of the hygroscopic seeding material on ground may include the step of calculating the mass concentration of the hygroscopic seeding material on ground during a given period of time, and the comparison between the calculated mass concentration of the hygroscopic seeding material and the mass concentrations of the aerosols observed on the execution date of the airborne cloud seeding experiment may include the step of conducting time-series analysis for distributions of the calculated mass concentration of the hygroscopic seeding material and distributions of the mass concentrations of the aerosols observed, during the given period of time.

According to the present invention, desirably, the distributions of the calculated mass concentration of the hygroscopic seeding material and the distributions of the mass concentrations of the aerosols observed, during the given period of time, are sorted according to points of a plurality of observatories for observing the aerosols.

According to the present invention, desirably, the step of calculating the contribution degree of the hygroscopic seeding material to the mass concentrations of the aerosols may include the step of determining a ratio of the mass concentration of the hygroscopic seeding material to the mass concentrations of the aerosols on a clock hour, when the mass concentration of the hygroscopic seeding material is distributed, among predetermined clock hours during the given period of time.

According to the present invention, desirably, the step of calculating the mass concentration of the hygroscopic seeding material on ground may include the step of determining the distributions of the mass concentration of the hygroscopic seeding material on ground according to the predetermined respective clock hours during the given period of time, and the comparison between the calculated mass concentration of the hygroscopic seeding material and the mass concentrations of the aerosols observed on the execution date of the airborne cloud seeding experiment may include the steps of: identifying a maximum mass concentration in the distributions of the mass concentration of the hygroscopic seeding material; identifying a first clock hour having the maximum mass concentration and the point of a first observatory for observing the aerosols, in which the maximum mass concentration is distributed; and identifying the mass concentrations of the aerosols observed on the point of a second observatory adjacent to the first observatory in the first clock hour on the execution date of the airborne cloud seeding experiment.

According to the present invention, desirably, the step of calculating the contribution degree of the hygroscopic seeding material to the mass concentrations of the aerosols may include the step of calculating the maximum mass concentration in the distributions of the mass concentration of the hygroscopic seeding material with respect to the mass concentrations of the aerosols observed on the point of the second observatory.

To accomplish the above-mentioned object, according to another aspect of the present invention, there is provided a server including: a memory for driving a numerical cloud seeding model and calculating and storing results; and a processor electrically connected to the memory, wherein the processor inputs information of an airborne cloud seeding experiment for spraying a hygroscopic seeding material and information of meteorological fields to the numerical cloud seeding model of the memory to execute a numerical simulation using the numerical cloud seeding model, calculates a mass concentration of the hygroscopic seeding material on the ground, based on results of the numerical simulation, and calculates a contribution degree of the hygroscopic seeding material to mass concentrations of aerosols, based on comparison between the calculated mass concentration of the hygroscopic seeding material and the mass concentrations of the aerosols observed on an execution date of the airborne cloud seeding experiment.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE EMBODIMENTS

Figure 1:
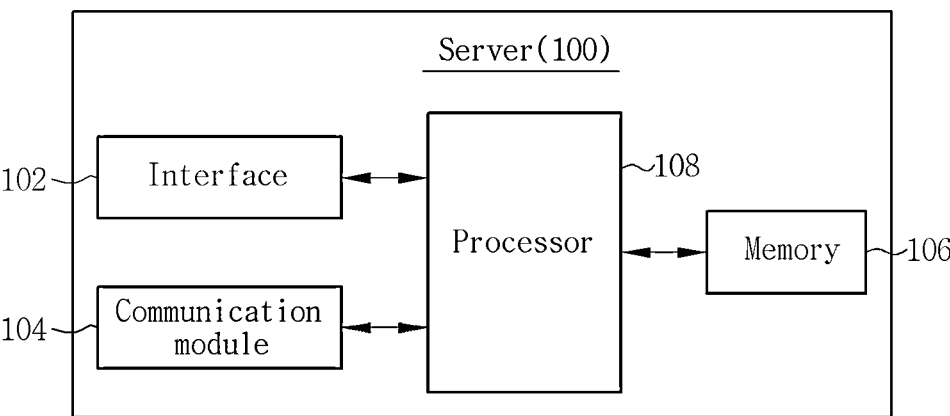
FIG. 1 is a block diagram showing a Linux or Unix server for analyzing an effect of a hygroscopic seeding material sprayed through an airborne cloud seeding experiment on ground aerosol concentrations according to an embodiment of the present invention.

The present invention may be modified in various ways and may have several exemplary embodiments. Specific exemplary embodiments of the present invention are illustrated in the drawings and described in detail in the detailed description. However, this does not limit the invention within specific embodiments and it should be understood that the invention covers all the modifications, equivalents, and replacements within the idea and technical scope of the invention. In the drawings, the corresponding parts in the embodiments of the present invention are indicated by corresponding reference numerals.

Terms, such as the first, the second, A, and B, may be used to describe various elements, but the elements should not be restricted by the terms. The terms are used to only distinguish one element from the other element. For example, a first element may be named a second element without departing from the scope of the present invention. Likewise, a second element may be named a first element. A term 'and/or' includes a combination of a plurality of relevant and described items or any one of a plurality of related and described items.

When it is said that one element is described as being "connected" or "coupled" to the other element, one element may be directly connected or coupled to the other element, but it should be understood that another element may be present between the two elements. In contrast, when it is said that one element is described as being "directly connected" or "directly coupled" to the other element, it should be understood that another element is not present between the two elements.

Terms used in this application are used to only describe specific exemplary embodiments and are not intended to restrict the present invention. An expression referencing a singular value additionally refers to a corresponding expression of the plural number, unless explicitly limited otherwise by the context. In this application, terms, such as "comprise", "include", or 'have", are intended to designate those characteristics, numbers, steps, operations, elements, or parts which are described in the specification, or any combination of them that exist, and it should be understood that they do not preclude the possibility of the existence or possible addition of one or more additional characteristics, numbers, steps, operations, elements, or parts, or combinations thereof.

All terms used herein, including technical or scientific terms, unless otherwise defined, have the same meanings which are typically understood by those having ordinary skill in the art. The terms, such as ones defined in common dictionaries, should be interpreted as having the same meanings as terms in the context of pertinent technology, and should not be interpreted as having ideal or excessively formal meanings unless clearly defined in the specification.

The present invention provides a method for analyzing an effect of a hygroscopic seeding material sprayed onto warm clouds through an airborne cloud seeding experiment on ground aerosol concentrations. In specific, the present invention provides a method for reducing a mass concentration of a seeding material on the ground through a numerical simulation using a numerical cloud seeding model.

Hereinafter, the present invention will be explained in detail with reference to the attached drawings.

FIG. 1 is a block diagram showing a server for analyzing an effect of a hygroscopic seeding material sprayed through an airborne cloud seeding experiment on ground aerosol concentrations according to an embodiment of the present invention. The server is a Linux or Unix server that operates a numerical model.

Referring to FIG. 1, a server 100 includes an interface 102, a communication module 104, a memory 106, and/or a processor 108.

The interface 102 supports a designated protocol so that the server 100 can be wiredly or wirelessly connected to an external device. For example, the interface 102 may include a high definition multimedia interface (HDMI), a universal serial bus (USB), a secure digital (SD) card interface, and the like.

The communication module 104 makes a wired or wireless communication channel between the server 100 and the external device and supports communication through the communication channel. For example, the communication module 104 may include a wireless communication circuit and/or wired communication circuit, and through the corresponding communication circuit, accordingly, the communication module 104 communicates with the external device.

According to the present invention, the server 100 receives information of meteorological field, seeding input, and aerosol mass concentration in an airborne cloud seeding experiment through the interface 102 or the communication module 104. For example, information of conditions for the airborne cloud seeding experiment may include information of time (seconds) when a hygroscopic seeding material is sprayed and/or information of position (inclusive of latitude, longitude, and/or altitude) onto which the hygroscopic seeding material is sprayed.

Further, the server 100 receives observation information related to various materials on the ground through the interface 102 or the communication module 104. For example, the server 100 receives information of aerosol mass concentrations on the ground observed by observation equipment of observatories during a given period of time from the interface 102 or the communication module 104 after the hygroscopic seeding material has been sprayed through the airborne cloud seeding experiment.

The memory 106 stores various data, for example, a software program and input or output data on commands related to the software program, used by at least one component of the server 100. The memory 106 may include a volatile and/or non-volatile memory.

According to the present invention, the memory 106 stores a software program that analyzes an effect of the hygroscopic seeding material sprayed through the airborne cloud seeding experiment on ground aerosol concentrations. The memory 106 can perform calculating, drawing, and storing for numerical model results.

The processor 108 controls the interface 102, the communication module 104, and/or the memory 106.

According to the present invention, the processor 108 can analyze the effect of the hygroscopic seeding material sprayed through the airborne cloud seeding experiment on ground aerosol concentrations, through the software program stored in the memory 106, based on the information of the conditions for the airborne cloud seeding experiment received from the interface 102 or the communication module 104.

The airborne cloud seeding experiment may include spraying the hygroscopic seeding material onto warm clouds (with a temperature greater than or equal to 0° C.) through an aircraft.

First, the processor 108 inputs information of meteorological fields and seeding inputs (seeding time, seeding altitude, position (grid information)) on a date when the airborne cloud seeding experiment is executed to a numerical model to perform a numerical simulation using a numerical cloud seeding model. The processor 108 calculates a mass concentration of the hygroscopic seeding material on the ground, based on numerical simulation results. For example, the processor 108 calculates a number concentration of the hygroscopic seeding material, based on the numerical simulation results.

Further, the processor 108 can calculate the mass concentration of the hygroscopic seeding material on the ground during a given period of time, based on the number concentration of the hygroscopic seeding material that is calculated from the numerical simulation using the numerical cloud seeding model.

Moreover, the processor 108 compares the calculated mass concentration of the hygroscopic seeding material to aerosol mass concentrations observed on the execution date of the airborne cloud seeding experiment to calculate a contribution degree of the hygroscopic seeding material (for example, calcium chloride) in the airborne cloud seeding experiment to ground aerosols, that is, aerosol mass concentrations.

For example, the processor 108 determines distributions of the calculated mass concentration of the hygroscopic seeding material and distributions of the aerosol mass concentrations observed, during the given period of time. In this case, the distributions of the calculated mass concentration of the hygroscopic seeding material and the distributions of the aerosol mass concentrations observed during the given period of time are sorted according to points indicating a plurality of observatories observing aerosols.

Further, the processor 108 performs time-series analysis for the distributions of the calculated mass concentration of the hygroscopic seeding material and the distributions for the aerosol mass concentrations observed during the given period of time. Through the time-series analysis, besides, the processor 108 determines a ratio of the mass concentration of the hygroscopic seeding material to the aerosol mass concentrations on a clock hour when the mass concentration of the hygroscopic seeding material is distributed, among predetermined clock hours during the given period of time.

For example, the processor 108 determines the distributions of the mass concentration of the hygroscopic seeding material on the ground according to the predetermined clock hours during the given period of time and thus identifies a maximum mass concentration in the distributions of the mass concentration of the hygroscopic seeding material. Further, the processor 108 identifies a clock hour (hereinafter referred to as a first clock hour) including the maximum mass concentration from the predetermined clock hours as well as a point of an observatory (hereinafter referred to as a first observatory) observing distributions of maximum aerosol mass concentrations.

Further, the processor 108 identifies aerosol mass concentrations observed on a point of an observatory (hereinafter referred to as a second observatory) adjacent to the first observatory in the first clock hour of the execution date of the airborne cloud seeding experiment. The processor 108 determines a ratio of the maximum mass concentration in the distributions of the mass concentration of the hygroscopic seeding material to the aerosol mass concentrations observed on the point of the second observatory.

The above-mentioned specific operations of the processor 108 will be explained in detail with reference to FIGS. 2 to 5.

On the other hand, some of the above-mentioned components of the server 100 as shown in FIG. 1 may be omitted, and otherwise, other components, which are not shown, may be added to the server 100.

Even though not shown in FIG. 1, for example, the server 100 may further include an input module (such as a mike, a mouse, and/or a keyboard) for receiving commands or data used in the component (for example, the processor 108) thereof from an outside (for example, a user).

Even though not shown in FIG. 1, further, the server 100 may further include an output module (such as a display and/or speaker) for providing information visually and/or audibly for the user of the server 100.

Figure 2:
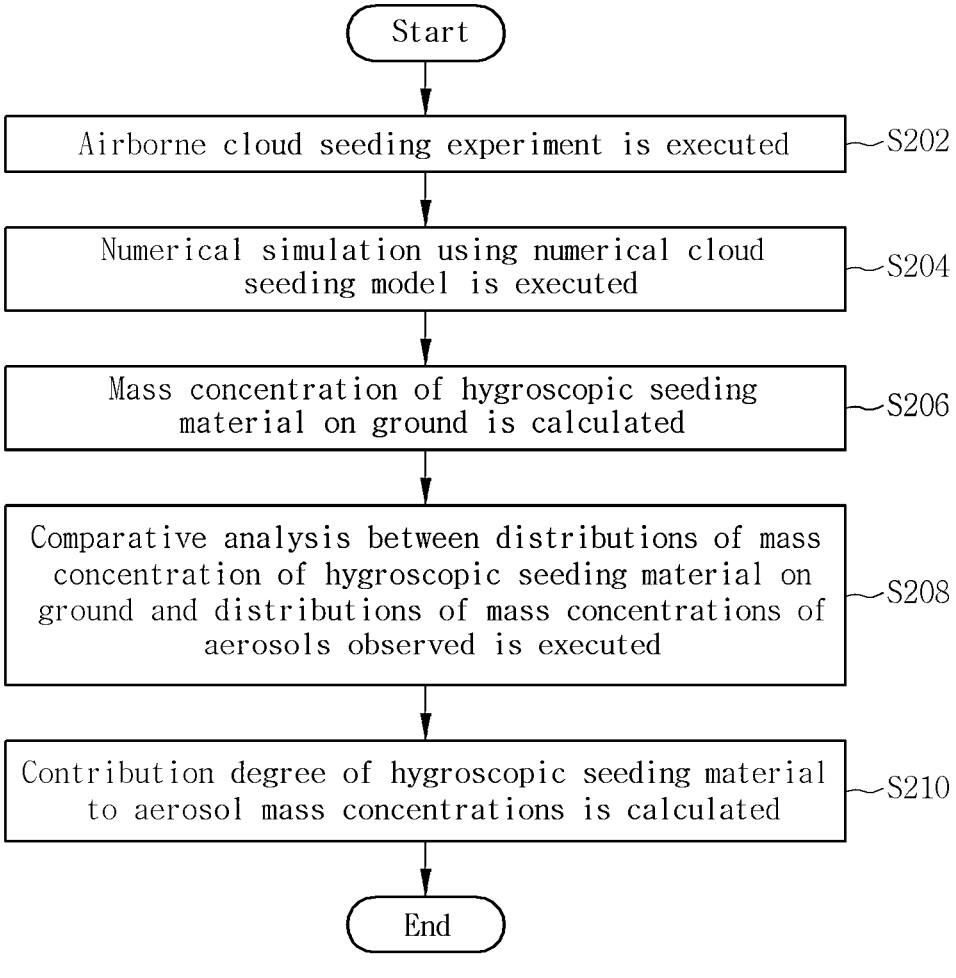
FIG. 2 is a flowchart showing a method for analyzing an effect of a hygroscopic seeding material sprayed through an airborne cloud seeding experiment on ground aerosol concentrations according to another embodiment of the present invention.

FIG. 2 is a flowchart showing a method for analyzing an effect of a hygroscopic seeding material sprayed through an airborne cloud seeding experiment on ground aerosol concentrations according to another embodiment of the present invention.

Referring to FIG. 2, a cloud seeding experiment using an aerial vehicle (or aircraft) for warm clouds (with a temperature greater than or equal to 0° C.) is executed (at step S202).

The aerial vehicle sprays a hygroscopic seeding material onto the warm clouds (with a temperature greater than or equal to 0° C.) by means of combustion of hygroscopic seeding flares through seeding material spray equipment mounted therein so as to produce precipitation from the warm clouds. For example, the hygroscopic seeding material may include calcium chloride, and the like.

For example, the aerial vehicle may be a manned or unmanned aerial vehicle, and the aerial vehicle may be provided with seeding material spray equipment, a cloud physics observation system (cloud particle and rain gauge), a global positioning system (GPS), and the like.

Next, a numerical simulation using a numerical cloud seeding model is conducted through the server 100 (or the processor 108 thereof) that drives and calculates the numerical simulation on the execution date of the airborne cloud seeding experiment (at step S204).

The server 100 reduces the cloud seeding information received through the interface 102, the communication module 104, or the input module to the seeding input information of the numerical cloud seeding model according to the execution of the airborne cloud seeding experiment and then conducts the numerical simulation using the numerical cloud seeding model, based on the seeding input information.

For example, information of the airborne cloud seeding experiment may include information of time (seconds) when the hygroscopic seeding material is sprayed and/or information of position (inclusive of latitude, longitude, and/or altitude) onto which the hygroscopic seeding material is sprayed.

For example, the seeding input information of the numerical cloud seeding model may include information of altitude levels, information of the eastern and western grids, information of the southern and northern grids, or information of latitude and longitude of the seeding position.

For example, the server 100 inputs a predetermined seeding rate (g/hr) to the numerical cloud seeding model through the interface 102, the communication module 104, or the input module thereof, and accordingly, the numerical simulation for spraying the hygroscopic seeding material using the numerical cloud seeding model can be conducted. Further, as the numerical cloud seeding model has parameterization for processes of cloud droplet absorption, autoconversion of the cloud droplets, and activation of the cloud droplets through the spraying simulation of the hygroscopic seeding material, the hygroscopic cloud seeding simulation can be conducted using the numerical cloud seeding model.

The server 100 (or the processor 108 thereof) calculates the mass concentration of the hygroscopic seeding material on the ground, based on numerical simulation results.

According to the present invention, particle size distributions of flares of calcium chloride as the hygroscopic seeding material in the numerical cloud seeding model are adopted with those as disclosed in Evaluation of Hygroscopic Cloud Seeding Flares, Journal of Weather Modification, 44, 69-94 of paper, Bruintjes et al., 2012.

Hereinafter, it is assumed that a density of calcium chloride ($CaCl_2$) as the hygroscopic seeding material is 2150 $kg/m^{-3}$, and according to the size distributions of the flares of the hygroscopic cloud seeding material (calcium chloride) as suggested in the paper, Bruintjes et al., 2012, it is assumed that the number of total particles of a first mode is 35000 $cm^{-3}$, a diameter of a geometric mean particle of the first mode is 0.27 μm, the number of total particles of a second mode is 173 $cm^{-3}$, and a diameter of a geometric mean particle of the second mode is 1 μm. Under the assumptions, accordingly, an operation of calculating the mass concentration of the hygroscopic seeding material on the ground will be explained through the following mathematical expressions.

First, the server 100 calculates a mean diameter of one particle of the hygroscopic seeding material, based on the number of total particles of the flares of the hygroscopic seeding material and the diameter of the geometric mean particle, which are all predetermined.

For example, the server 100 calculates the mean diameter $D_n$ of one particle of calcium chloride as the hygroscopic seeding material, based on the above-mentioned assumptions, through Mathematical expression 1.

[Mathematical expression 1]

$$D_n = \frac{\sum n_i D_i}{\sum n_i} = \left(0.27 \ \mu m \times 35000 \ cm^{-3} + \left(1 \ \mu m \times 173 \ cm^{-3}\right)\right)/35173 \ cm^{-3}$$

$$= \sim 0.27 \ \mu m$$

9 wherein n indicates a diameter of a geometric mean particle, D the number of total particles, i first mode, second mode, . . . .

Next, the server 100 calculates a volume of one mean particle of the hygroscopic seeding material, based on the mean diameter of one particle of the hygroscopic seeding material.

For example, the server 100 calculates a volume V of one mean particle of calcium chloride as the hygroscopic seeding material, based on the above-mentioned assumptions, through Mathematical expression 2.

[Mathematical expression 2]

$$V = \frac{4}{3}\pi r^3 =$$

$$(4 \times 3.14/3) \times (0.135 \times 10^{-6})^3 m^3 = 0.002460 * 10^{-18} = \sim 2.460 \times 10^{-21} m^8$$

wherein r indicates (mean diameter of one particle)/2.

After that, the server 100 calculates mean mass of one particle of calcium chloride as the hygroscopic seeding material, based on the predetermined density of the hygroscopic seeding material and the volume of one mean particle calculated through Mathematical expression 2, through Mathematical expression 3.

Mean mass of one particle of hygroscopic seeding material=density of hygroscopic seeding material×volume of one mean particle of hygroscopic seeding material=about 5.289×10$^{-9}$ μg.  [Mathematical expression 3]

The server 100 calculates a mass concentration of the hygroscopic seeding material, based on the number concentration of the hygroscopic seeding material and the mean mass of one particle of the hygroscopic seeding material, which is calculated through Mathematical expression 3.

A number concentration (# m$^{-3}$) of the hygroscopic seeding material as a variable is calculated from the numerical simulation using the numerical cloud seeding model. For example, a unit of the number concentration variable of the hygroscopic seeding material is the number of particles (# kg$^{-1}$) per 1 kg dried air, and to allow the unit reduction of the number concentration variable to be calculated to the number of particles per unit volume, a density of air can be multiplied.

For example, the server 100 calculates the mass concentration of the hygroscopic seeding material through Mathematical expression 4.

Mass concentration of hygroscopic seeding material=Number concentration of hygroscopic seeding material (# m$^{-3}$)×mean mass of one particle of hygroscopic seeding material (μg).  [Mathematical expression 4]

The server 100 (or the processor 108 thereof) conducts comparative analysis between the distributions of the mass concentration of the hygroscopic seeding material on the ground and the distributions of the aerosol mass concentrations observed (at step S208).

The server 100 (or the processor 108 thereof) calculates a contribution degree of the hygroscopic seeding material to the aerosol mass concentrations, based on results of the comparative analysis between the distributions of the mass concentration of the hygroscopic seeding material on the ground and the distributions of the aerosol mass concentrations observed (at step S210).

The server 100 calculates distributions of the mass concentration of the hygroscopic seeding material on the ground according to the results of the numerical simulation of the airborne cloud seeding experiment. For example, the server 100 produces and outputs horizontal distributions of the mass concentration of the hygroscopic seeding material on the ground, as shown in FIG. 3.

Figure 3:
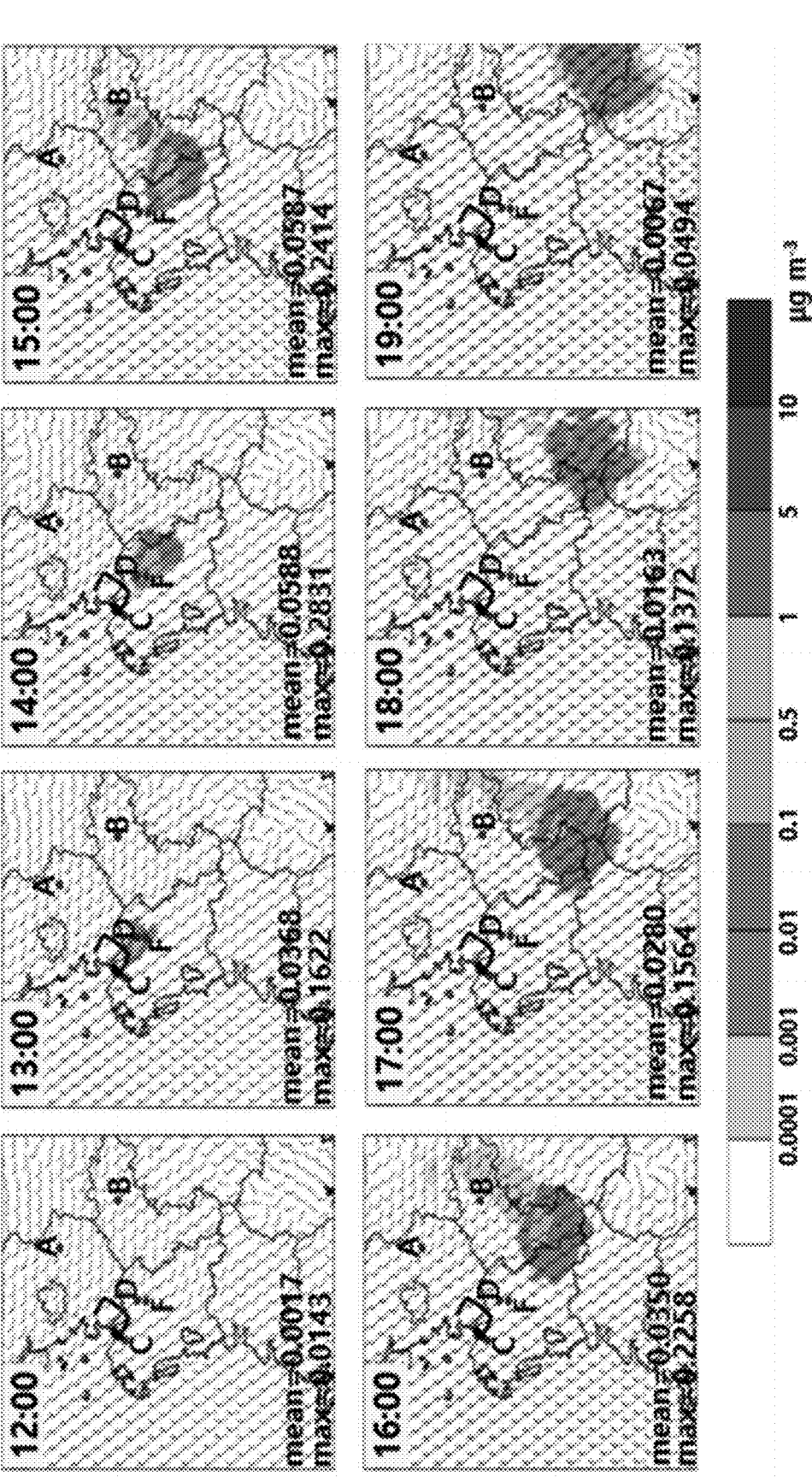
FIG. 3 shows horizontal distributions of the mass concentration of the hygroscopic seeding material on the ground through numerical simulation results according to the present invention.
Figure 4:
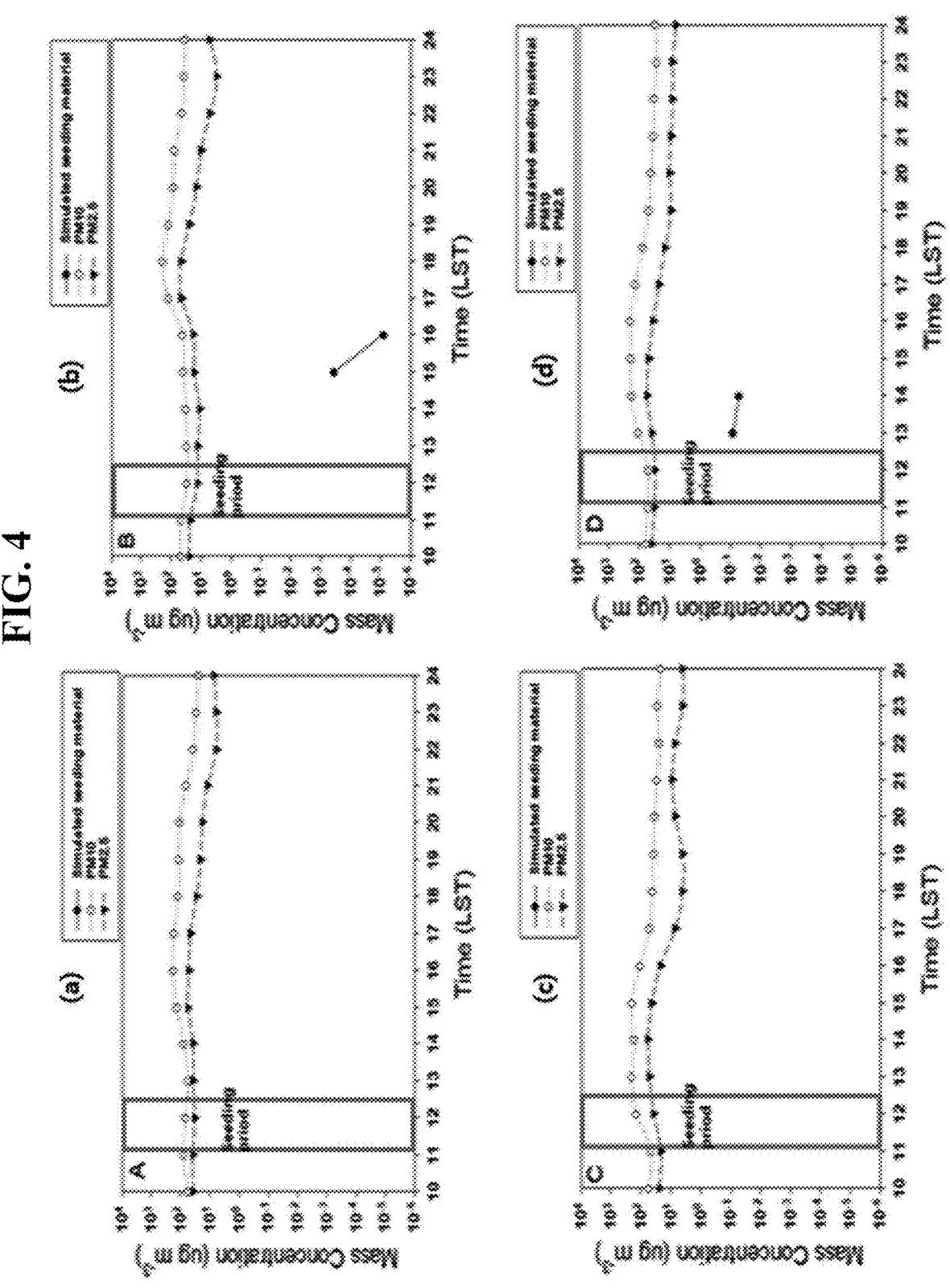
FIG. 4 is time-series graphs showing one-hour average mass concentrations of the hygroscopic seeding material and measured aerosol mass concentrations on points A, B, C, and D of FIG. 3.
Figure 5:
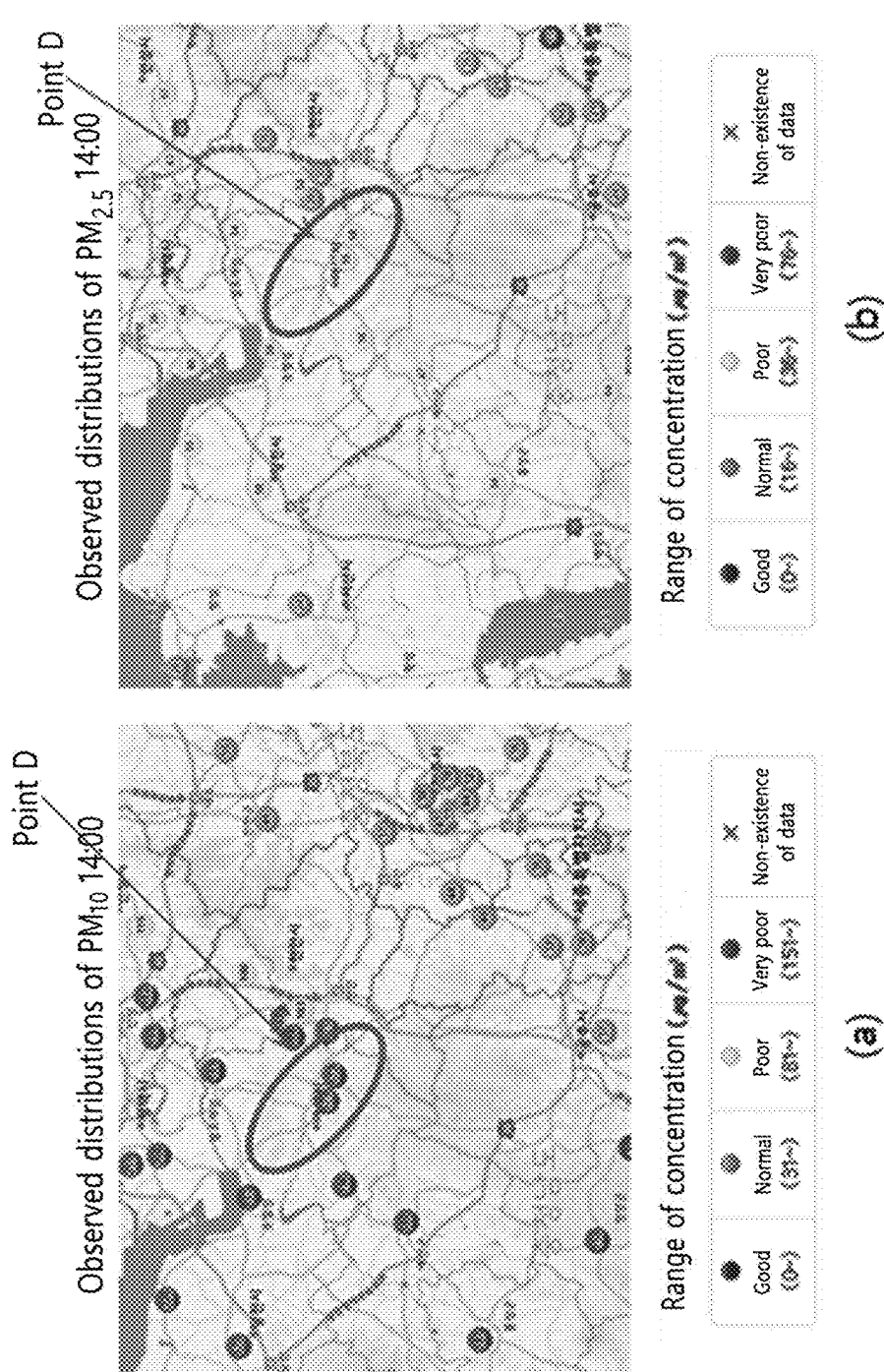
FIG. 5 shows distributions of mass concentrations of the aerosols observed on a date of FIG. 3.

FIG. 3 shows horizontal distributions of the mass concentration of the hygroscopic seeding material on the ground using the results of the numerical simulation according to the present invention.

Referring to FIG. 3, the server 100 calculates mean and maximum values of the mass concentration of the hygroscopic seeding material on the ground according to respective clock hours (for example, 12:00, 13:00, 14:00, 15:00, 16:00, 17:00, 18:00, and 19:00).

The mean and maximum values of the mass concentration of the hygroscopic seeding material on the ground according to the respective clock hours, as shown in FIG. 3, indicate the mean and maximum values of the mass concentration of the hygroscopic seeding material on the ground from one hour ago from each clock hour to the corresponding clock hour.

Points A, B, C, and D of FIG. 3 indicate the locations of the observatories for observing the mass concentrations of PM$_{10}$ and PM$_{2.5}$ aerosols defined as fine particles by Ministry of Environment.

Referring to FIG. 3, the server 100 identifies a point F where the maximum value of the mass concentration of the hygroscopic seeding material appears through the results of the numerical simulation, and further, the server 100 identifies the point D as the aerosol observatory closest to the point F.

According to an embodiment of the present invention as will be discussed later, the PM$_{10}$ and PM$_{2.5}$ aerosols are the results of one-hour average observation, and to perform the comparison between the aerosol mass concentrations and the mass concentration of the hygroscopic seeding material, accordingly, one-hour average mass concentration of the hygroscopic seeding material is calculated.

Further, the server 100 receives the observation information for the aerosol mass concentrations during a given period of time on the date when the airborne cloud seeding experiment is executed on each observatory point for observing the aerosol mass concentrations through the interface 102 or the communication module 104.

Further, the server 100 compares the distributions of the mass concentration of the hygroscopic seeding material on the ground to the distributions of the mass concentrations of the measured aerosols through time-series analysis. As shown in FIGS. 4A to 4D, for example, the server 100 produces and outputs time-series graphs showing one-hour average mass concentration of the hygroscopic seeding material and the mass concentrations of the measured aerosols on the respective observatory points for observing the mass concentrations of the aerosols.

FIGS. 4A to 4D are time-series graphs showing the one-hour average mass concentration of the hygroscopic seeding material and the mass concentrations of the measured aerosols on the points A, B, C, and D of FIG. 3.

As shown in FIGS. 4A to 4D, the aerosols are indicated by PM$_{10}$ and PM$_{2.5}$, and the hygroscopic seeding material by simulated seeding material. Further, FIG. 4A shows the time-series graph on the point A, FIG. 4B the time-series graph on the point B, FIG. 4C the time-series graph on the point C, and FIG. 4D shows the time-series graph on the point D.

Referring to FIGS. 4A and 4C, the line for indicating the mass concentration of the hygroscopic seeding material does not appear on the time-series graphs, and accordingly, the server 100 recognizes that the hygroscopic seeding material does not reach the points A and C on the ground.

Referring to FIG. 4B, contrarily, the server 100 identifies the line for indicating the mass concentration of the hygroscopic seeding material between 15:00 and 16:00, and accordingly, the server 100 recognizes that the hygroscopic seeding material reaches the point B on the ground between 15:00 and 16:00. Based on the comparison between the mass concentration of the hygroscopic seeding material and the mass concentration of the $PM_{10}$ aerosols observed, in this case, the server 100 recognizes that the mass concentration of the hygroscopic seeding material is about one over one hundred thousand of the mass concentration of the $PM_{10}$ aerosols observed.

Referring to FIG. 4D, further, the server 100 identifies the line for indicating the mass concentration of the hygroscopic seeding material between 13:00 and 14:00, and accordingly, the server 100 recognizes that the hygroscopic seeding material reaches the point D on the ground between 13:00 and 14:00. Based on the comparison between the mass concentration of the hygroscopic seeding material and the mass concentration of the $PM_{10}$ aerosols observed, in this case, the server 100 recognizes that the mass concentration of the hygroscopic seeding material is about one over one hundred thousand of the mass concentration of the $PM_{10}$ aerosols observed.

Like this, the server 100 analyzes the effect of the hygroscopic seeding material on the ground aerosol mass concentrations through the time-series analysis for the mass concentrations of the aerosols and the mass concentration of the hygroscopic seeding material according to the respective points.

On the other hand, the observation information for the mass concentrations of the aerosols during the given period of time on the date when the airborne cloud seeding experiment is executed, which has been transmitted to the server 100 from the interface 102 or the communication module 104, may include observation distributions of the aerosols, as shown in FIGS. 5A and 5B. For example, the observation distributions of the aerosols are provided through https://www.airkorea.or.kr/map.

Accordingly, the server 100 identifies the distributions of the mass concentrations of the aerosols on the date when the airborne cloud seeding experiment is executed through the observation distributions of the aerosols as shown in FIGS. 5A and 5B.

FIGS. 5A and 5B show the distributions of the mass concentrations of the aerosols observed on the date of FIG. 3.

Referring back to FIG. 3, the server 100 identifies that the maximum mass concentration of calcium chloride as the hygroscopic seeding material on the ground is about 0.28 ug $m^{-3}$ on the point F at 14:00 o'clock (Averaged between 13:00 and 14:00).

Referring to FIGS. 5A and 5B, further, the server 100 identifies that the mass concentration of the $PM_{10}$ aerosols of about 170 ug $m^{-3}$ and the mass concentration of the $PM_{2.5}$ aerosols of about 50 ug $m^{-3}$ are observed on the point D closest to the point where the maximum mass concentration of calcium chloride as the hygroscopic seeding material on the ground appears at 14:00 o'clock (Averaged between 13:00 and 14:00).

Accordingly, the server 100 compares the maximum mass concentration of the hygroscopic seeding material on the ground through the airborne cloud seeding experiment to the mass concentration of the $PM_{10}$ aerosols observed to thus recognize that the mass concentration of the hygroscopic seeding material is just an amount of about 0.16% of the $PM_{10}$ aerosols and compares the maximum mass concentration of the hygroscopic seeding material on the ground through the airborne cloud seeding experiment to the mass concentration of the $PM_{10}$ aerosols observed to thus recognize that the mass concentration of the hygroscopic seeding material is just an amount of about 0.56% of the $PM_{2.5}$ aerosols, so that the server 100 calculates the contribution degree of the hygroscopic seeding material to the aerosols.

According to the present invention, there is the method for analyzing the effect of the hygroscopic seeding material sprayed through the airborne cloud seeding experiment on the ground aerosol concentrations through the numerical simulation results. According to the present invention, further, the contribution degree of the hygroscopic seeding material through the cloud seeding to the ground aerosol concentrations can be calculated through the effect analysis, thereby checking the safety in the airborne cloud seeding experiment.

The present invention can be applied to fields of analyzing the effect of hygroscopic seeding materials sprayed through airborne cloud seeding experiments on environments.

As described above, the method is capable of analyzing the effect of the hygroscopic seeding material sprayed through the airborne cloud seeding experiment on the ground aerosol concentrations.

For example, after the airborne cloud seeding experiment is executed to spray the hygroscopic seeding material onto warm clouds (with a temperature greater than or equal to 0° C.), the mass concentration of the hygroscopic seeding material on the ground is calculated based on the numerical simulation using the numerical cloud seeding model, and the time-series analysis for the distributions of the calculated mass concentration of the hygroscopic seeding material and the distributions of the mass concentrations of the aerosols observed is performed. According to the present invention, next, the comparison between the maximum mass concentration of the hygroscopic seeding material on the ground and the mass concentrations of the aerosols observed on the point closest to the point where the maximum mass concentration is checked is performed, and accordingly, the contribution degree of the hygroscopic seeding material to the ground aerosol mass concentrations is calculated.

According to the present invention, for example, through the calculation of the mass concentration of the hygroscopic seeding material and the analysis of the mass concentration of the ground aerosols that are carried out based on the number concentration of the hygroscopic seeding material which reaches the ground in the numerical simulation results of the cloud seeding, the mass concentration of the hygroscopic seeding material when the sprayed hygroscopic seeding material reaches the ground through the airborne cloud seeding experiment is calculated to analyze the effect of the hygroscopic seeding material sprayed through the airborne cloud seeding experiment on the ground aerosol concentrations.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method comprising:

analyzing an effect of a hygroscopic seeding material sprayed onto clouds by an aircraft through an airborne cloud seeding experiment on ground aerosol concentrations, wherein analyzing the effect comprises the steps of:

inputting information of meteorological fields and information of seeding spraying of the airborne cloud seeding experiment for spraying the hygroscopic seeding material to a numerical cloud seeding model, wherein the information of the seeding spraying comprises seeding time, seeding rate, and spraying position, and the spraying position comprises grid information, and the information of the meteorological fields and the information of the seeding spraying corresponds to an execution date of the airborne cloud seeding experiment;

executing a hygroscopic cloud seeding simulation based on the information of the meteorological fields and the information of the seeding spraying using the numerical cloud seeding model, wherein in the executing of the hygroscopic cloud seeding simulation, the numerical cloud seeding model models absorption of the hygroscopic seeding material by cloud droplets comprised in the clouds, auto-conversion of the cloud droplets into a different state, and activation of the cloud droplets;

calculating a mass concentration of the hygroscopic seeding material on the ground with respect to the execution date of the airborne cloud seeding experiment in which the aircraft sprayed the hygroscopic seeding material onto the clouds, based on results of the hygroscopic cloud seeding simulation;

comparing:

the calculated mass concentration of the hygroscopic seeding material on the ground, as calculated based on the results of the hygroscopic cloud seeding simulation executed using the numerical cloud seeding model; and mass concentrations of aerosols observed on the ground on the execution date of the airborne cloud seeding experiment;

calculating a contribution degree of the hygroscopic seeding material on the ground to the mass concentrations of aerosols observed on the ground, based on the comparison;

determining a safety level associated with the airborne cloud seeding experiment with respect to the ground based on calculating the contribution degree of the hygroscopic seeding material on the ground; and generating and outputting a visual representation of the hygroscopic seeding material on the ground with respect to time, based on the hygroscopic cloud seeding simulation, wherein the visual representation comprises mean values and maximum values of the calculated mass concentration of the hygroscopic seeding material on the ground with respect to time.

2. The method according to claim 1, wherein the step of calculating the mass concentration of the hygroscopic seeding material on the ground is carried out based on calculating a number concentration of the hygroscopic seeding material from the hygroscopic cloud seeding simulation using the numerical cloud seeding model.

3. The method according to claim 2, wherein the step of calculating the mass concentration of the hygroscopic seeding material on the ground comprises the steps of:

calculating a mean diameter of one particle of the hygroscopic seeding material, based on the number of total particles of flares of the hygroscopic seeding material and a diameter of a geometric mean particle, which are all predetermined;

calculating a volume of one mean particle of the hygroscopic seeding material, based on the calculated mean diameter of one particle of the hygroscopic seeding material;

calculating mean mass of one particle of the hygroscopic seeding material, based on a density of the hygroscopic seeding material and the calculated volume of one mean particle of the hygroscopic seeding material; and calculating the mass concentration of the hygroscopic seeding material, based on the calculated mean mass of one particle of the hygroscopic seeding material and the number concentration of the hygroscopic seeding material.

4. The method according to claim 1, wherein:

the step of calculating the mass concentration of the hygroscopic seeding material on the ground comprises the step of calculating the mass concentration of the hygroscopic seeding material on the ground during a given period of time, and the comparison between the calculated mass concentration of the hygroscopic seeding material on the ground and the mass concentrations of the aerosols observed on the ground on the execution date of the airborne cloud seeding experiment comprises the step of conducting time-series analysis for distributions of the calculated mass concentration of the hygroscopic seeding material on the ground and distributions of the mass concentrations of the aerosols observed, during the given period of time, the visual representation further comprises the distributions of the calculated mass concentration of the hygroscopic seeding material on the ground and the distributions of the mass concentrations of the aerosols observed, during the given period of time.

5. The method according to claim 4, wherein the distributions of the calculated mass concentration of the hygroscopic seeding material on the ground and the distributions of the mass concentrations of the aerosols observed, during the given period of time, are sorted according to points of a plurality of observatories for observing the aerosols.

6. The method according to claim 5, wherein the step of calculating the contribution degree of the hygroscopic seeding material to the mass concentrations of the aerosols comprises the step of determining a ratio of the mass concentration of the hygroscopic seeding material to the mass concentrations of the aerosols on a clock hour, when the mass concentration of the hygroscopic seeding material is distributed, among predetermined clock hours during the given period of time.

7. The method according to claim 4, wherein:

the step of calculating the mass concentration of the hygroscopic seeding material on the ground comprises the step of determining the distributions of the mass concentration of the hygroscopic seeding material on the ground according to predetermined respective clock hours during the given period of time, and the comparison between the calculated mass concentration of the hygroscopic seeding material on the ground and the mass concentrations of the aerosols observed on the ground on the execution date of the airborne cloud seeding experiment comprises the steps of:

identifying a maximum mass concentration in the distributions of the mass concentration of the hygroscopic seeding material;

identifying a first clock hour having the maximum mass concentration and a point of a first observatory for observing the aerosols, in which the maximum mass concentration is distributed; and identifying the mass concentrations of the aerosols observed on the point of a second observatory adjacent to the first observatory in the first clock hour on the execution date of the airborne cloud seeding experiment.

8. The method according to claim 7, wherein the step of calculating the contribution degree of the hygroscopic seeding material on the ground to the mass concentrations of the aerosols comprises the step of calculating the maximum mass concentration in the distributions of the mass concentration of the hygroscopic seeding material on the ground with respect to the mass concentrations of the aerosols observed on the point of the second observatory.

9. A server comprising:

a memory for driving a numerical cloud seeding model and calculating and storing results; and a processor electrically connected to the memory, wherein the processor analyzes an effect of a hygroscopic seeding material sprayed by an aircraft through an airborne cloud seeding experiment on ground aerosol concentrations, wherein in analyzing the effect of the hygroscopic seeding material, the processor:

inputs information of an airborne cloud seeding experiment for spraying a hygroscopic seeding material and information of meteorological fields to the numerical cloud seeding model of the memory, wherein the information of the seeding spraying comprises seeding time, seeding rate, and spraying position, and the spraying position comprises grid information, and the information of the meteorological fields and the information of the seeding spraying corresponds to an execution date of the airborne cloud seeding experiment, executes a hygroscopic cloud seeding simulation based on the information of the meteorological fields and the information of the seeding spraying using the numerical cloud seeding model, wherein in the executing of the hygroscopic cloud seeding simulation, the numerical cloud seeding model models absorption of the hygroscopic seeding material by cloud droplets comprised in the clouds, auto-conversion of the cloud droplets into a different state, and activation of the cloud droplets, calculates a mass concentration of the hygroscopic seeding material on the ground with respect to the execution date of the airborne cloud seeding experiment in which the aircraft sprayed the hygroscopic seeding material onto the clouds, based on results of the hygroscopic cloud seeding simulation, compares the calculated mass concentration of the hygroscopic seeding material on the ground, as calculated based on the results of the hygroscopic cloud seeding simulation executed using the numerical cloud seeding model, and mass concentrations of aerosols observed on an execution date of the airborne cloud seeding experiment, calculates a contribution degree of the hygroscopic seeding material to mass concentrations of aerosols, based on the comparison, determines a safety level associated with the airborne cloud seeding experiment with respect to the ground based on the calculated contribution degree of the hygroscopic seeding material on the ground, and generates and outputs a visual representation of the hygroscopic seeding material on the ground with respect to time, based on the hygroscopic cloud seeding simulation, wherein the visual representation comprises mean values and maximum values of the calculated mass concentration of the hygroscopic seeding material on the ground with respect to time.

* * * * *